(12) United States Patent
Oh

(10) Patent No.: US 6,529,428 B2
(45) Date of Patent: Mar. 4, 2003

(54) MULTI-BIT PARALLEL TESTING FOR MEMORY DEVICES

(75) Inventor: Jong-Hoon Oh, Fremont, CA (US)

(73) Assignee: G-Link Technology, Hsin Chu (TW)

( * ) Notice: Subject to any disclaimer, the term of this patent is extended or adjusted under 35 U.S.C. 154(b) by 8 days.

(21) Appl. No.: 09/863,151

(22) Filed: May 22, 2001

(65) Prior Publication Data

US 2002/0176294 A1 Nov. 28, 2002

(51) Int. Cl.⁷ .................................................. G11C 7/00
(52) U.S. Cl. .................. 365/201; 365/702; 365/189.05; 365/189.07; 365/189.02; 365/230.04
(58) Field of Search ............................. 365/201, 189.05, 365/202, 189.07, 189.02, 230.04

(56) References Cited

U.S. PATENT DOCUMENTS

| | | | | |
|---|---|---|---|---|
| 5,367,492 A | * | 11/1994 | Kawamoto et al. | 365/190 |
| 5,706,234 A | * | 1/1998 | Pilch et al. | 365/189.01 |
| 5,717,652 A | * | 2/1998 | Ooishi | 365/201 |
| 6,243,839 B1 | * | 6/2001 | Roohparvar | 365/185.29 |
| 6,301,166 B1 | * | 10/2001 | Ooishi | 365/201 |
| 6,421,789 B1 | * | 7/2002 | Ooishi | 365/201 |

* cited by examiner

Primary Examiner—Richard Elms
Assistant Examiner—Tuan T. Nguyen
(74) Attorney, Agent, or Firm—Townsend and Townsend and Crew LLP; J. Matthew Zigmant

(57) ABSTRACT

A method and apparatus for testing memory devices. One embodiment provides a method including receiving a first input data bit having a first polarity, and receiving a second input data bit having a second polarity, wherein the second polarity is the complement of the first polarity. The method also includes writing the first input data bit to a first portion of a plurality of memory cells, writing the second input data bit to a second portion of a plurality of memory cells, and reading data bits from the first and second portions of the plurality of memory cells. An active signal is generated if the data bits read from the first portion of the plurality of memory cells and complements of the data bits read from the second portion of the plurality of memory cells each have the same polarity.

20 Claims, 9 Drawing Sheets

MULTI-BIT PARALLEL TESTING FOR MEMORY DEVICES

BACKGROUND OF THE INVENTION

Memory devices have become ubiquitous over the last several years, and are now the backbone of almost every new piece of technology, such as mobile phones, MP3 players, palmtop computing devices, internet appliances, and digital cameras, to name just a few. Also, they remain a key component in personal computers, networks, and servers. Though the use of memory devices has increased, competition in the memory marketplace has become fierce, and the price that memories command continues to decrease. Manufactures seek to reduce every element that makes up the cost of their products. One of these is the cost of testing.

Manufactures of integrated circuit memory devices test each chip before assembling it in a package. This reduces the costs associated with building integrated circuits that are later discarded. The packaged parts are retested to eliminate any devices which are inadvertently destroyed during assembly.

The costs associated with these tests can be high, and are often higher than the cost of the actual silicon chip. Test machines are expensive, and an operator must be nearby to facilitate the process. If it takes longer to test a device, then more testers and operators are needed. This results in a higher testing cost per unit. Some manufactures have even found it more cost effective to skip the first round of testing, even though this leads to building bad parts which are later thrown away.

Also, the complexity of these devices has become such that to improve their testability, additional circuitry not used in the device's operating mode is included on-chip. But this circuitry adds to the chip die size, making it more expensive. This can be considered as a part of the total test cost.

Optimal testing of these devices includes the use of various patterns, such as a solid, row stripe, column stripe, and checkerboard. These are explained further below. Unfortunately, the use of these patterns can increase test time. What is needed are methods and apparatus for testing memory devices using these patterns, with minimal additional circuitry requirements, in a fast efficient manner.

BRIEF SUMMARY OF THE INVENTION

Accordingly, embodiments of the present invention provide for effectively shortening device test time by testing multiple devices simultaneously. This is done by reducing the number of pins accessed by a test system. Specifically, one device pin provides the input data for several memory cells. In this way, a tester's limited number of probes are allocated among multiple devices, and the tester can test more than one device at a time.

These embodiments of the present invention further provide methods and apparatus for testing memory devices in solid, row stripe, column stripe, checkerboard, and other patterns; they compensate for the reduction in input signals and allow full testing using these patterns. These methods and apparatus require little additional circuitry despite having fewer input signals available.

One exemplary embodiment of the present invention provides a method including receiving a first input data bit having a first polarity, and receiving a second input data bit having a second polarity, wherein the second polarity is the complement of the first polarity. The method also includes writing the first input data bit to a first portion of a plurality of memory cells, writing the second input data bit to a second portion of a plurality of memory cells, and reading data bits from the first and second portions of the plurality of memory cells. An active signal is generated if the data bits read from the first portion of the plurality of memory cells and complements of the data bits read from the second portion of the plurality of memory cells all have the same polarity.

A further embodiment of the present invention provides a memory device. This device includes an input/output pad, a first plurality of write buffers coupled to the input/output pad, and a first plurality of multiplexers coupled to the input/output pad a second plurality of write buffers, each coupled to one of the first plurality of multiplexers. Also included are a first plurality of memory cells, each selectively coupled to one of the first plurality of write buffers, and a second plurality of memory cells, each selectively coupled to one of the second plurality of write buffers. A first plurality of sense amplifiers, each selectively coupled to one of the first plurality of memory cells, a second plurality of sense amplifiers, each selectively coupled to one of the second plurality of memory cells, and a second plurality of multiplexers, each coupled to one of the second plurality of sense amplifiers are also included.

Yet a further exemplary embodiment of the present invention provides a memory device including means for writing data having a first polarity to a first plurality of memory cells, means for writing data having either the first polarity, or a complement of the first polarity to a second plurality of memory cells, and means for reading data from the first plurality of memory cells. Also included are means for reading data from the second plurality of memory cells, and means for checking the polarity of the data from each of the first plurality of memory cells and the second plurality of memory cells.

Another exemplary embodiment of the present invention provides a method of testing a memory device, the memory device including a plurality of memory cells arranged in rows and columns, each of which are written to by one of either a plurality of even write circuits, or a plurality of odd write circuits, wherein the memory cells that are written to by an even write circuit are read by an even read circuit, and the memory cells that are written to by an odd write circuit are read by an odd read circuit. The method itself includes selecting a first row of memory cells, selecting a first column of memory cells, and providing an input bit. A status bit is checked to determine if it is active, and if it is then the input bit is provided to both the odd and even write circuits; else the input bit is provided to the odd write circuits, and a complement of the input bit is provided to the even write circuits. Data is then written from the even and odd write circuits to memory cells in the selected row and column.

A better understanding of the nature and advantages of the present invention may be gained with reference to the following detailed description and the accompanying drawings.

BRIEF DESCRIPTION OF THE DRAWINGS

FIGS. 1A–1D are examples of data patterns that may be written to a group of memory cells;

DETAILED DESCRIPTION OF THE INVENTION

Figure 2:
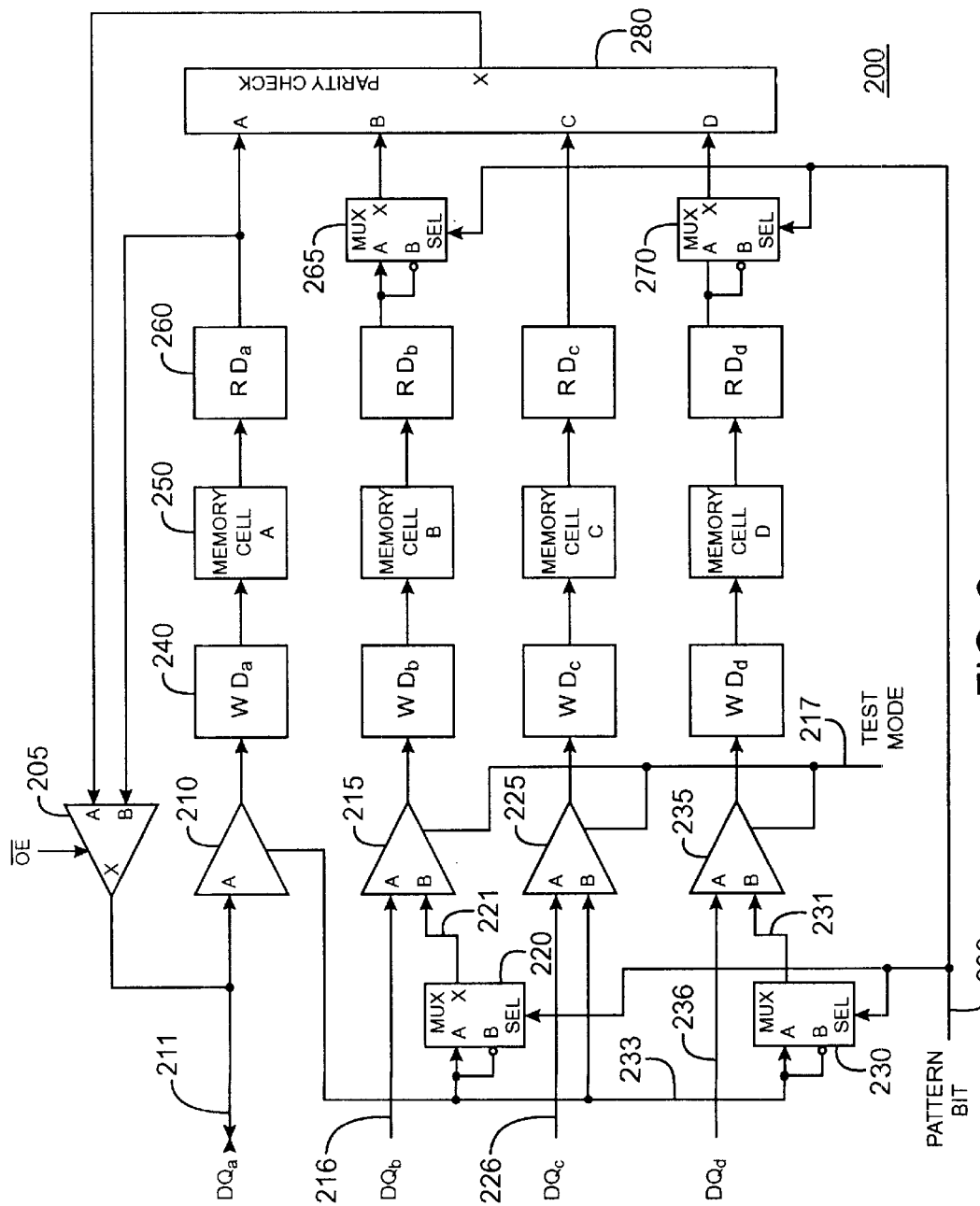
FIG. 2 is a block diagram of a portion of a memory device along with testing circuitry consistent with an embodiment of the present invention.

FIGS. 1A, 1B, 1C, and 1D, each show data stored in a group of memory cells. In an embodiment of the present invention, these memory cells are contiguous. Data is shown as being stored in arrays of four rows 150, R0 through R3, by four columns 160, C0 through C3. These four columns are often addresses simultaneously, that is they have the same address, but are accessed by different input and output pins. The number of columns simultaneously addressed may be greater than four. For example, 16, 32, 64, or more columns may be addressed at once.

These patterns may be expanded to cover any number of rows and any number of columns. These patterns may also be used with memories divided into any number of groups of arrays and sub-arrays. The memory cells may be those in a DRAM, SRAM, flash memory, or other storage device. These memory cells may be in a memory device that is primarily a memory, such as a DRAM, or it may be in a memory device that incorporates other functions, such as a Video RAM. Alternately, it may be in a memory device that primarily serves a different purpose, and only uses a memory as part of that function, such as a color look-up palette for graphics systems, and other mixed-mode devices.

Figures 1A, 1B, 1C, 1D:
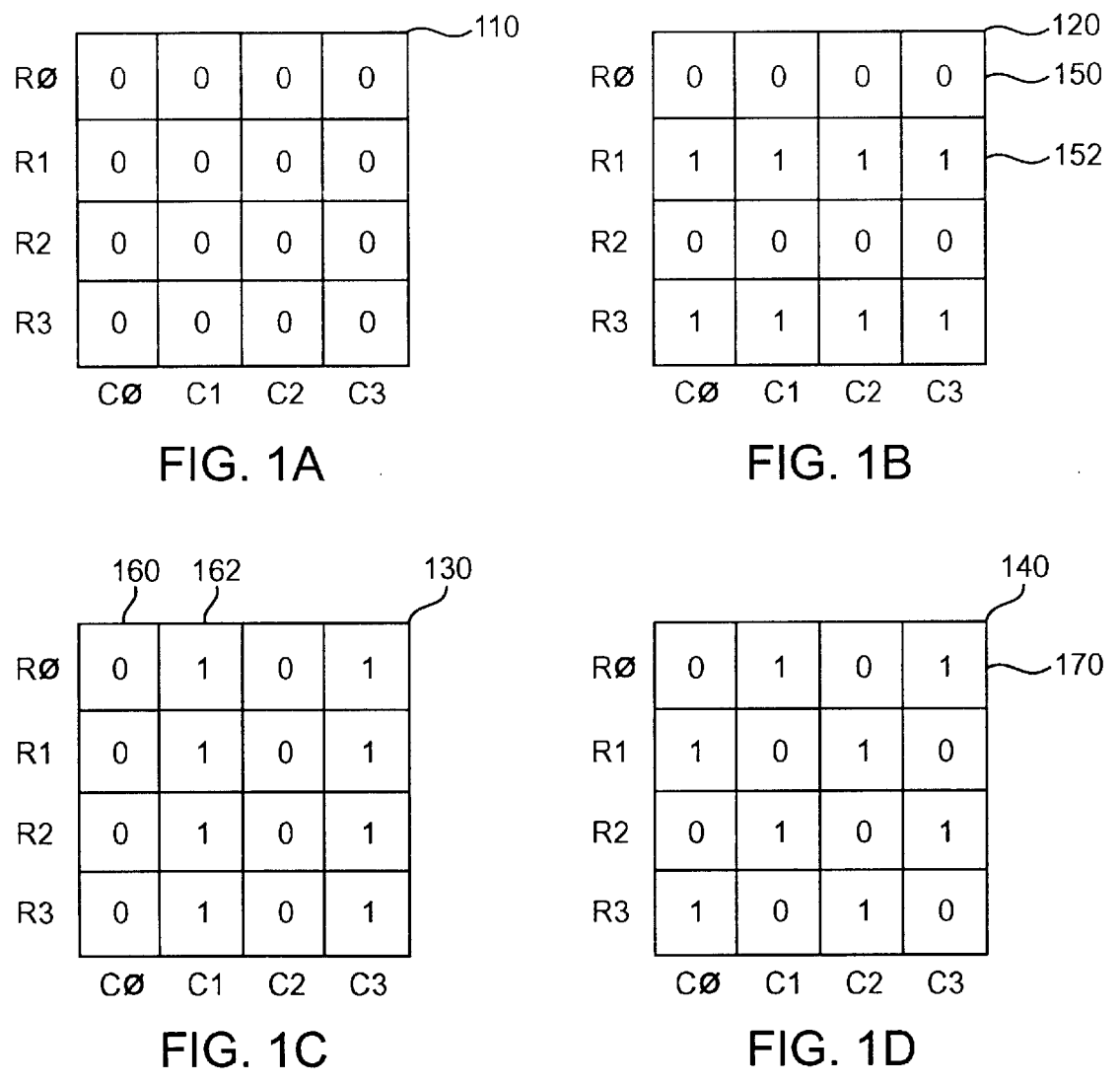

Each figure represents a data pattern useful in the testing of memory devices. The patterns are referred to respectively as solid, row stripe, column stripe, and checkerboard. The solid pattern shown in FIG. 1A is useful for checking that each memory cells can store both high and low data bits. For example, a pattern of solid zeros may be written and read from memory, followed by a pattern of solid ones. The row stripe pattern of FIG. 1B is useful in determining the sensitivity of memory cells to corruption from neighboring word lines. Specifically, bits written in row R0 150 can be checked for sensitivity to bits of the opposite polarity being written to neighboring row R1. For example, and a there may be 30 excessive capacitance, or even a short, from the word line of row R1 152 to a memory cell in row R0 150.

The column stripes pattern of FIG. 1C is useful for determining the sensitivity of data stored in a memory cell to corruption from neighboring bit lines. For example, bits written in column C0 160 may be checked for sensitivity to bits of the opposite polarity being written to column C1 162. Again, there may be excess capacitance, or other circuit flaw between the bit line of column C1 162 and one or more bits in column C0 160.

Perhaps the most useful of these data patterns is the checkerboard of FIG. 1D. Each memory cell 170 is surrounded on each of its four sides by memory cells storing bits of the opposite polarity. This pattern is useful for checking the sensitivity of a memory cell to corruption caused by adjoining memory cells along its bit and word lines storing a bit of the opposite polarity. There are 65 thousand patterns possible for just these 16 bits, these four are shown since they are desirable patterns for testing.

FIG. 2 shows a portion of a memory device along with circuitry for testing a group of memory cells that is consistent with an embodiment of the present invention. This method of testing is referred to as multi-bit parallel testing. This figure, as with all the included figures, is for illustrative purposes only, and does not limit the possible applications of the present invention, or limit the appended claims. Four memory cells are shown. It will be obvious to one skilled in the art that this number may be increased or decreased. For example, 2, 8, 16, or more memory cells may be written to at the same time during testing. The memory cells shown can be in the same row as indicated in FIG. 1; they have a common word line, and separate bit lines. Included are input buffers 210, 215, 225, and 235, write drivers 240 (or write circuits, or write buffers), memory cells 250, read drivers 260 (also referred to as read circuits or sense amplifiers), and output driver 205. A separate output driver 205 is provided at the output of each read driver 260, though only output driver 205 is shown for clarity. Input buffers 215, 225, and 235 act as multiplexers under control of the test mode signal on line 217, passing data from the input lines DQi during normal operations, and selecting data at their B inputs during testing.

Additional circuitry for testing is also shown. In one embodiment, this circuitry is not used in the device's operational mode. Included are multiplexers 220, 230, 265, and 270, and parity-check block 280. A test mode signal is applied on line 217; an active signal on this line puts the device in its test mode. A pattern bit signal is applied on line 232, and controls whether solid and row stripe, or column stripe and checkerboard patterns are used. In this example, the multiplexers are associated with the second and fourth channels. Alternately, the multiplexers may be associated with other channels. Also, more than one pattern bit, possibly with decoding logic, may be used.

In the operational mode, that is when the memory device is functioning in a system, the test mode signal on line 217 is inactive. The A inputs of input buffers 210, 215, 225, and 235 are selected. Data signals DQa on line 211, DQb on line 216, DQc on line 226, and DQd on line 236 are passed to the write drivers 240. Each write driver may be connected to one of several memory cells, as selected by a row decoder which is not shown. The write drivers 240 write data to the memory cells 250. When data is read from the memory cells 250, sense amplifiers located in read drivers 260 amplify and restore signals from the memory cells and provide them to output buffers 205, which in turn drive the data onto lines 211, 216, 226, and 236.

When the device is under test, the test mode signal on line 217 is active. The B inputs of input buffers 215, 225, and 235, are selected. Input signal DQa on line 211 is buffered and provided on line 233 to multiplexers located in front of alternating buffers, here the second and fourth, and directly to the remaining input buffer. The multiplexers select, under control of the pattern bit on line 232, either the signal DQa, or its compliment. If a checkerboard or column stripes pattern is desired, the pattern bit on line 232 is high and the inverting B input of multiplexers 220 and 230 are selected. If a solid or row stripe pattern is desired, the pattern bit signal on line 232 is low and the non-inverting A inputs of multiplexers 220 and 230 are selected. The data at the A input of input buffer 210 and the B input of input buffers 215, 225, and 235 are written by word drivers 240 to the memory cells 250.

After all or a desired number of memory cells in the memory device have been written to, the data from memory cells 250 are read by read drivers 260. Some of the read drivers 260 connect directly to the parity-check block 280, others connect to multiplexers. In one embodiment, the read drivers associated with data paths that have a multiplexer in front of their input buffer also connect to a multiplexer. In this example, the second and fourth channels have multiplexers before their amplifiers, and at the output of their read drivers. The multiplexers either pass the data unchanged or invert it before sending it to the parity-check block 280. It will be obvious to one skilled in the art that other embodiments of the invention are possible. For example, in an alternate embodiment the read drivers associated with data paths that do not have a multiplexer in front of their input buffer connect to a multiplexer, and the read drivers associated with data paths that do have a multiplexer in front of their input buffer do not connect to a multiplexer.

If testing is to be done using a solid or row stripe pattern, data is passed unchanged through the input multiplexers 220 and 230 during writing, and remains unchanged through the multiplexers 265 and 270 during a read. The four data bits presented to the parity-check block 280 are thus equal, assuming the cells functioned properly. The parity-check block 280 then outputs a pass signal, which can be read at the DQa pin. If there is an error, one or more bits may be different, and the parity-check block outputs a fail signal.

If testing is to be done using a column stripe or checkerboard pattern, data is inverted in the input multiplexers 220 and 230 before a write, and is again inverted in the multiplexers 265 and 270 following a read. Since the data in the second and fourth channels is inverted twice, the four data bits presented to the parity-check block 280 are again equal, assuming the cells functioned properly. The parity-check block 280 then outputs a pass signal, which can be read at the DQa pin. If there is an error, one or more bits may be different, and the parity-check block outputs a fail signal.

As a simple example of how bad memory cells may be detected, a situation in which all memory cells are stuck low may be considered. In that case, half the write drivers try to write a one, the other half try to write a low. When all lows are read, the multiplexers 265 and 270 invert the lows to a high, and accordingly half the inputs to the parity-check block are high, and half are low. The parity-check block thus appropriately sends a fail signal to the output DQa.

This architecture allows the testing a memory device using the solid, row stripe, column stripe, and checkerboard patterns with a simple test program and a minimum amount of additional circuitry. For example, a method of testing a device with a solid pattern includes providing a data input signal DQa on line 211. The signal DQa on line 211 is amplified by the input buffer 210 and provided to the multiplexer 220, input buffer 225, and multiplexer 230. The pattern bit on line 232 is low, thus the A inputs of multiplexer 220 and multiplexer 230 are selected and the signal DQa is provided unchanged to input buffers 215 and 235. A first word line is selected, and write drivers 240 write the data in the memory cells 250. The signal level of DQa on line 211 remains unchanged, and a next word line is selected. The process is repeated, changing column and row addresses, until all, or a desired group of memory cells, have been written to. At that point, the first word line is again selected and the memory cells are read. Alternately, other cells may be read first, though writing and reading cells in the same sequence generally simplifies testing. The A inputs of multiplexers 265 and 270 are selected since the pattern bit on line 232 is low, so they pass data from their respective read drivers unchanged to the parity-check block 280. The parity-check block 280 outputs a pass signal if all its inputs are equal, else it passes a fail signal. The pass and fail signals may be separate signals, or they may be the same signal with opposite polarities. The process is repeated, changing column and row addresses, until all, or a desired group of memory cells, have been read from.

A method of testing a memory devices with a row stripe pattern includes providing a data input signal DQa on line 211. The signal DQa on line 211 is amplified by the input buffer 210 and provided to the multiplexer 220, input buffer 225, and multiplexer 230. The pattern bit on line 232 is low, thus the A inputs of multiplexer 220 and multiplexer 230 are selected, and the signal DQa is provided unchanged to the input buffers 215 and 235. A first word line is selected, and write drivers 240 write the data in memory cells 250. The signal DQa is then changed to provide a bit of the opposite polarity. The signal DQa on line 211 is again amplified by the input buffer 210 and provided to the multiplexer 220 input buffer 230 and multiplexer 230. The pattern bit on line 232 remains low, thus the A inputs of the multiplexer 220 and multiplexer 230 remains active, and the signal DQa is provided unchanged to the input buffers 215 and 235. The next word line is selected, and the write drivers 240 write the new data to the next memory cells 250. All the memory, or a desired group of memory cells, are written to in this fashion, with the input DQa alternating in polarity for each word line. The first word line is selected and the memory cells are read by the read drivers 260. The A inputs of multiplexers 265 and 270 are active, and thus pass the data from their read drivers to the parity-check block 280 unchanged. For each word line the parity-check block 280 checks that the data bits at its inputs all have the same polarity, and if so sends a pass signal to the output buffer 205 If the inputs are not equal, a fail signal is sent to the output buffer 205.

A method of testing and memory devices with a column stripes pattern includes providing a data bit DQa on line 211. The signal DQa on line 211 is amplified by the input buffer 210 and provided to the multiplexer 220, input buffer 225, and multiplexer 230. The pattern bit on line 232 is high, thus the B inputs of multiplexer 220 and multiplexer 230 are selected, and the signal DQa is inverted and provided to input buffers 215 and 235. A first word line is selected, and write drivers 240 store the data in memory cells 250. The signal DQa on line 211 remains unchanged, the next word line is selected and the process repeated, changing column and row addresses, until all, or a desired group of memory cells, have been written to. At that point, the first word line is again selected and the memory cells are read. The B inputs of multiplexers 265 and 270 are active, thus they invert the data from their respective read drivers before sending it to the parity-check block 280. The parity-check block 280 outputs a pass signal if all its inputs are equal, else it passes a fail signal.

A method of testing memory devices with a checkerboard pattern includes providing a bit DQa on line 211. Again, the signal is amplified by input buffer 210 and provided to multiplexer is 220, input buffer 225, and multiplexer 230. The pattern bit on line 232 is high, thus the B inputs of multiplexer 220 and multiplexer 230 are active, the signal DQa is inverted and provided to input buffers 215 and 235. A first word line is selected, and write drivers 240 write the data in memory cells 250. The signal DQa is then changed to provide a bit of the opposite polarity. The signal DQa on line 211 is again amplified by the input buffer 210 and provided to the multiplexer 220, input buffer 230, and multiplexer 230. The pattern bit on line 232 remains high, thus the B inputs of the multiplexer 220 and multiplexer 230 remains selected and the signal DQa is inverted and provided to the input buffers 215 and 235. The next word line is selected and the write drivers 240 write this new data to the next memory cells 250. All the memory, or a desired group of memory cells, are written to in this fashion, with the input DQa alternating in polarity for each word line. Next, the first word line is selected, and the memory cells are read by the read drivers 260. The B inputs of multiplexers 265 and 270 are active, thus the data from their read drivers is inverted and sent to the parity-check block 280. As before, the parity-check block outputs a pass signal if its inputs are equal, else it passes a fail signal.

Figure 3A:
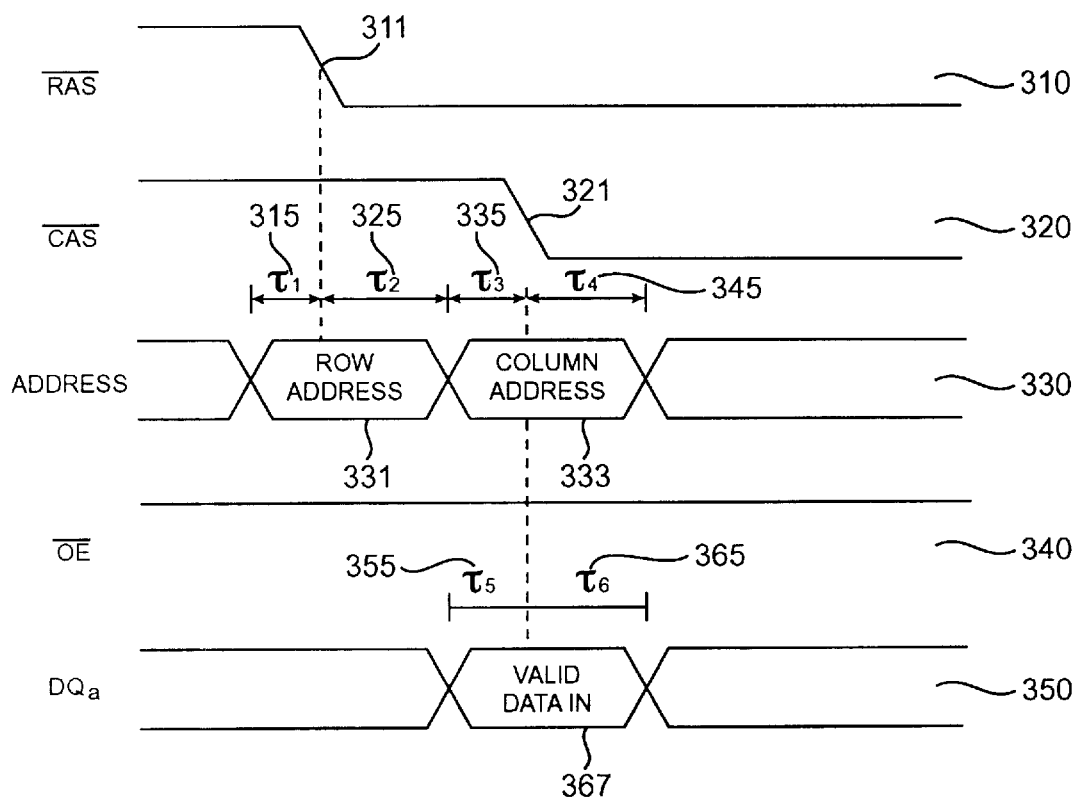
FIGS. 3A and 3B are representative timing diagrams used in writing to and reading from a memory device under test consistent with an embodiment of the present invention.
Figure 3B:
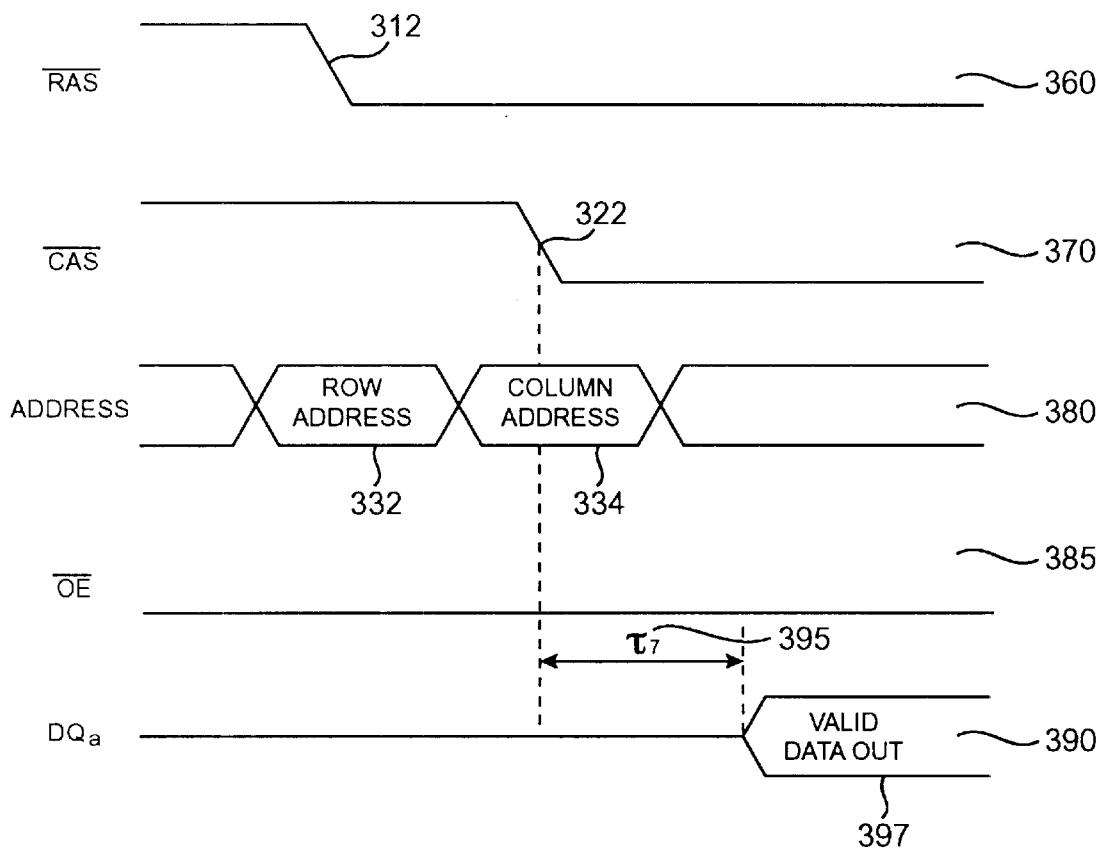

FIGS. 3A and 3B are timing diagrams used by an embodiment of the present invention for writing data to, and reading data from memory cells during operation and testing of the device. FIG. 3A can be used for writing to a memory device. Included in FIG. 3A are the signals $\overline{RAS}$ (row address select bar) 310, $\overline{CAS}$ (column address select bar) 320, address 330, $\overline{OE}$ (output enable bar) 340, and data inputs DQi 350. Row address 331 is provided at an address input port a time $t_1$ 315 before, and held for a time $t_2$ 325 after the falling edge 311 of the $\overline{RAS}$ signal 310. Similarly a column address is provided at the address port for a time $t_3$ 335 before, and held a time $t_4$ 345 after a falling edge 321 of the $\overline{CAS}$ signal 320. The $\overline{OE}$ signal 340 is held high, thus disabling the device output buffers and enabling the its input buffers. Data to be written to the memory cells selected by the row address 331 and column address 333 is provided at the data input a time $t_5$ 355 before, and $t_6$ 365 after the falling edge 321 of the $\overline{CAS}$ signal 320. In this way the data input 367 can be written to the memory cells selected by the row address 331 and column address 333. Other write timing is possible. For example, a row address may be selected, followed by a sequence of $\overline{CAS}$ pulses and associated column addresses.

FIG. 3B is a timing diagram and for the read path during operation and testing of a memory device in a manner consistent with an embodiment of the present invention. Included are $\overline{RAS}$ signal 360, $\overline{CAS}$ signal 370, address signal 380, $\overline{OE}$ signal 385, and data output 390. Row address 332 is present at the address signal input before and after the falling edge 312 of the $\overline{RAS}$ signal 360. Similarly, the column address 334 is available at the address inputs before and after a falling edge 322 of the $\overline{CAS}$ signal 370. The $\overline{OE}$ signal 385 may be held low such that the output buffers attached to the data input-output pins DQi are enabled, while the input buffers attached to these pins are disabled. An amount of time $t_7$ 395 after the falling edge 322 of the $\overline{CAS}$ signal 370, valid data will appear at the DQi input-output pins. Other read timing is possible. For example, a row address may be selected, followed by a sequence of $\overline{CAS}$ pulses and associated column addresses. Using these timing diagrams, data patterns either the same or similar to those shown in FIGS. 1A–1D may be written to the memory cells of a memory device, and then read back for verification.

Figure 4:
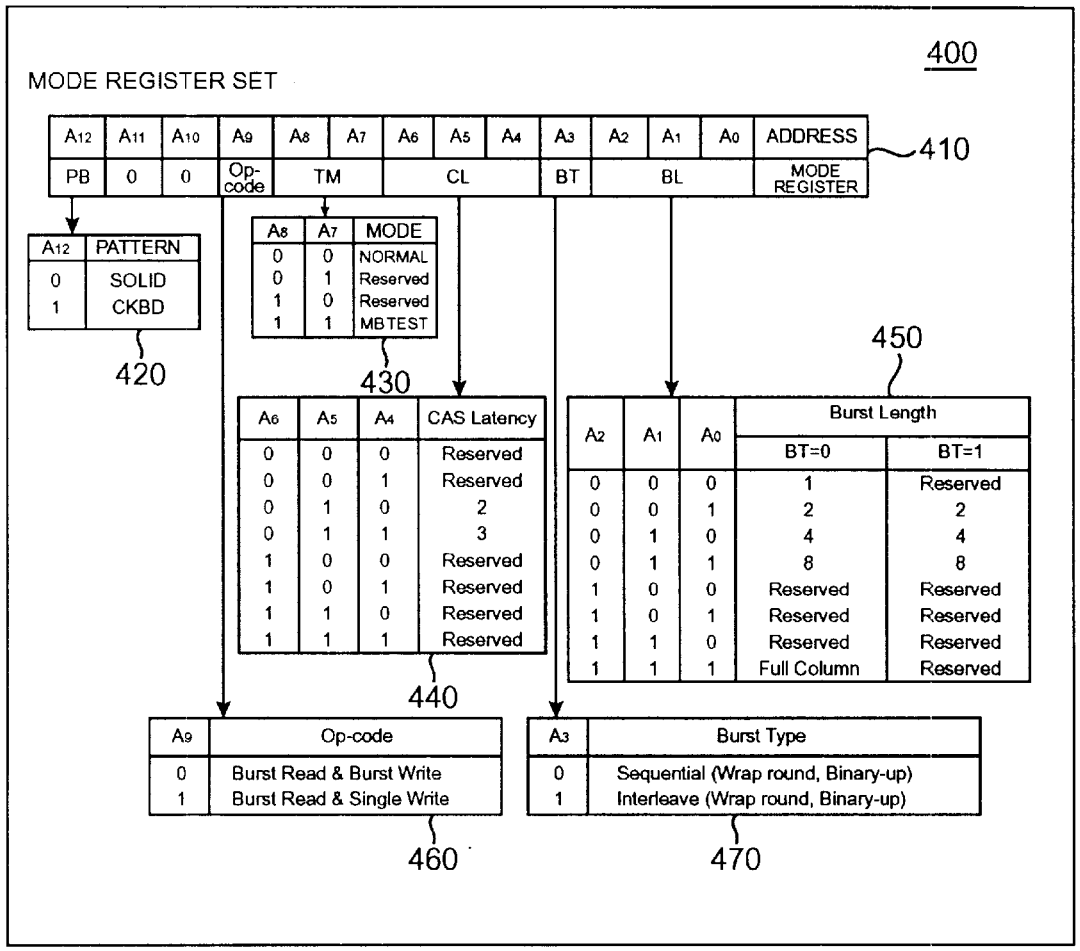
FIG. 4 shows the contents of a mode register for a memory device which may be tested consistent with an embodiment of the present invention.

FIG. 4 illustrates the use of the contents of a mode register 410. Such a mode register 410 may be used by memory devices in accordance with an embodiment of the present invention. The mode register 410 has 13 storage locations labeled A0 through A12. Of particular importance to the present invention are bits A12, the function of which is explained by block 420, and bits A7 and A8, explained by block 430. Bit A12 is the pattern bit. A low for this bit enables the testing of the memory using solid and row stripe patterns, as well as other similar patterns. A high for this bit enables the testing of the memory using a checkerboard, column stripe, among other patterns.

Bits A7 and A8 configure the device for either the operational or test modes. For example, as shown in box 430, if both bits are low, the device is in the normal, or operational mode. If both of these bits are high, the device is in the multi-bit parallel test mode. The other states may map to either the operational or test modes, or may be reserved for other functions.

The other bits may be used to define other parameters as shown in boxes 440, 450, 460, and 470. Specifically, an embodiment of the present invention uses the lowest three bits, A0 through A8, to find the burst length period, and A3 is used to define the burst type. The next three bits, A4 through A6, define the $\overline{CAS}$ latency, and bit A9 is the operational code.

Figure 5:
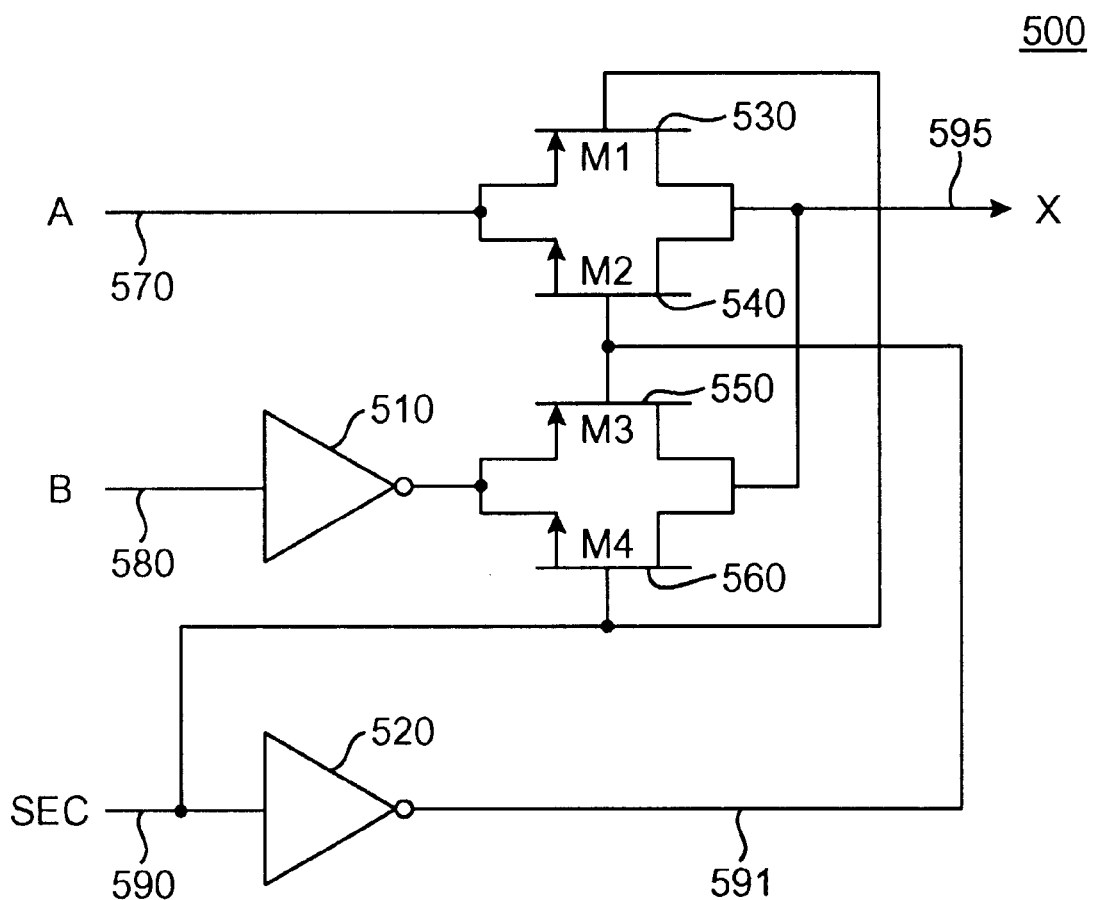
FIG. 5 is a schematic of a multiplexer that may be used in the block diagram of FIG. 2.

FIG. 5 is a schematic of a multiplexer which may be used as one or more of the multiplexers 220, 230, 265, and 270 in FIG. 2. This multiplexer, with the inverter 510 removed, may also be used to provide the multiplexing function of input buffers 215, 225, and 235 in the circuit of FIG. 2; it may also be used to provide the multiplexing function of output buffer 205. Shown are a first transmission gate including p-channel device M1 530 and n-channel device M2 540, a second transmission gate including p-channel device M3 550, and n-channel device M4 560, and inverters 510 and 520. An input signal A is provided on input line 570, which connects to the first transmission gate, and an input signal B is provided on input line 580, which connects to inverter 510. Inverter 510 drives the second transmission gate. The output of the first and second transmission gates connect together to form the output of the multiplexer, line 595. A SEL signal is provided on line 590, and couples either signal A on line 570 through the first transmission gate, or the inverse of signal B through the second transmission gate, to the output line 595 as output signal X.

Specifically, when the SEL signal is high device M4 is conducting and device M1 is off. The inverse of the SEL signal on line 591 is low, thus M3 550 conducts and M2 540 is off. The output of inverter 510 is coupled through the conducting devices M3 550 and M4 560 to the output line 595. Similarly, if the SEL signal on line 590 is low, device M4 560 is off and device M1 530 is conducting. The inverse of the SEL signal on line 591 is high, thus M2 540 is conducting and M3 550 is off. Accordingly, the signal A on line 570 passes through the conducting devices M1 530 and M2 540, and becomes the output signal X on line 595.

Figure 6:
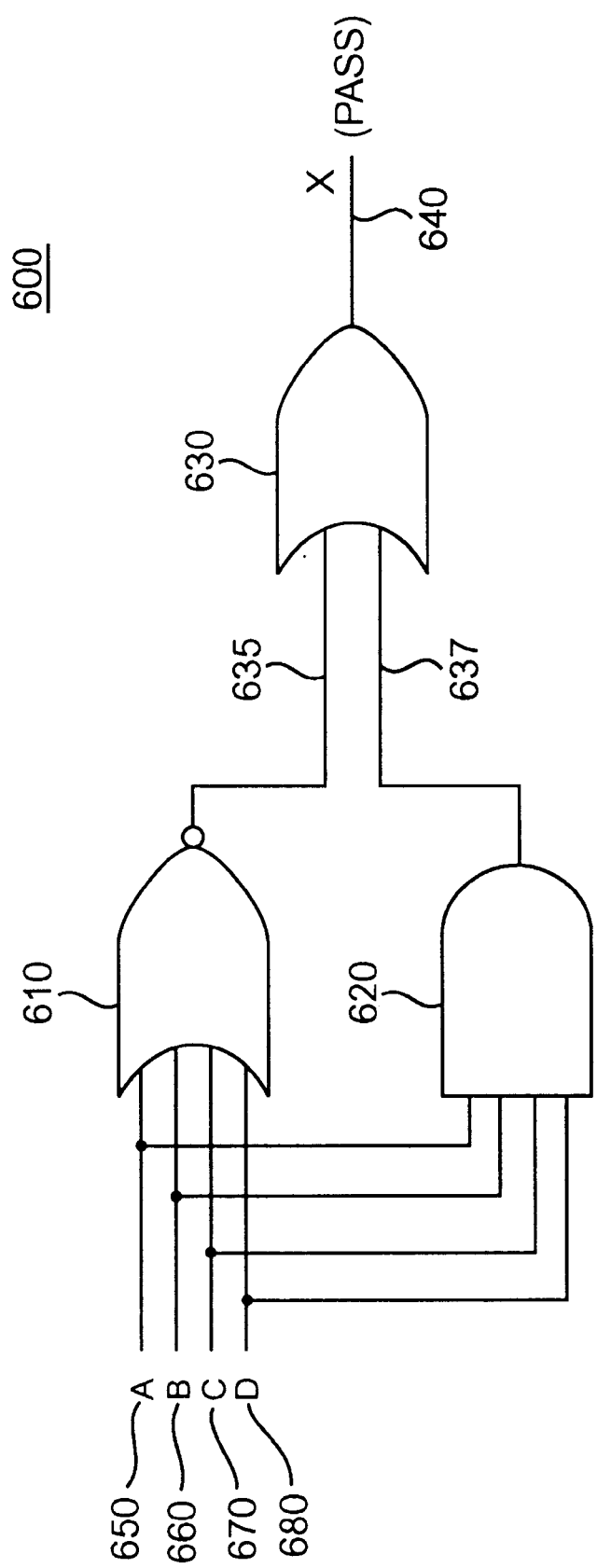
FIG. 6 is a schematic of a parity-check block that may be used in the block diagram of FIG. 2.

FIG. 6 is a schematic of a parity-check block which may be used to as the parity-check block 280 in FIG. 2. Included are a four input NOR gate 610, four input AND gate 620 and two input OR gate 630. The number of inputs of the NOR gate 610 and AND gate 620 may be changed if the number of memory cells simultaneously tested changes is varied. As an example, in a circuit such at the one shown in FIG. 2, six memory cells may be tested simultaneously. In that case, a six input NOR gate and a six input AND gate may be used. Input signals A on line 650, B on line 660, C on line 670, and D on line 680, connect to respective inputs of both the NOR gate 610 and AND gate 620. The signal on line 635 can be high only if all four inputs of NOR gate 610 are low. Similarly, only if all four inputs to AND gate 620 are high, is the signal on line 637 high. If either the signal on line 635 or the signal on line 637 are high, the OR gate 630 is high. The output signal X on line 640 may be used as the pass signal. Accordingly, only if the four input signals A through D are all high or all low, is the output signal X on line 640 high, otherwise it is low, indicating a fail.

Figure 7:
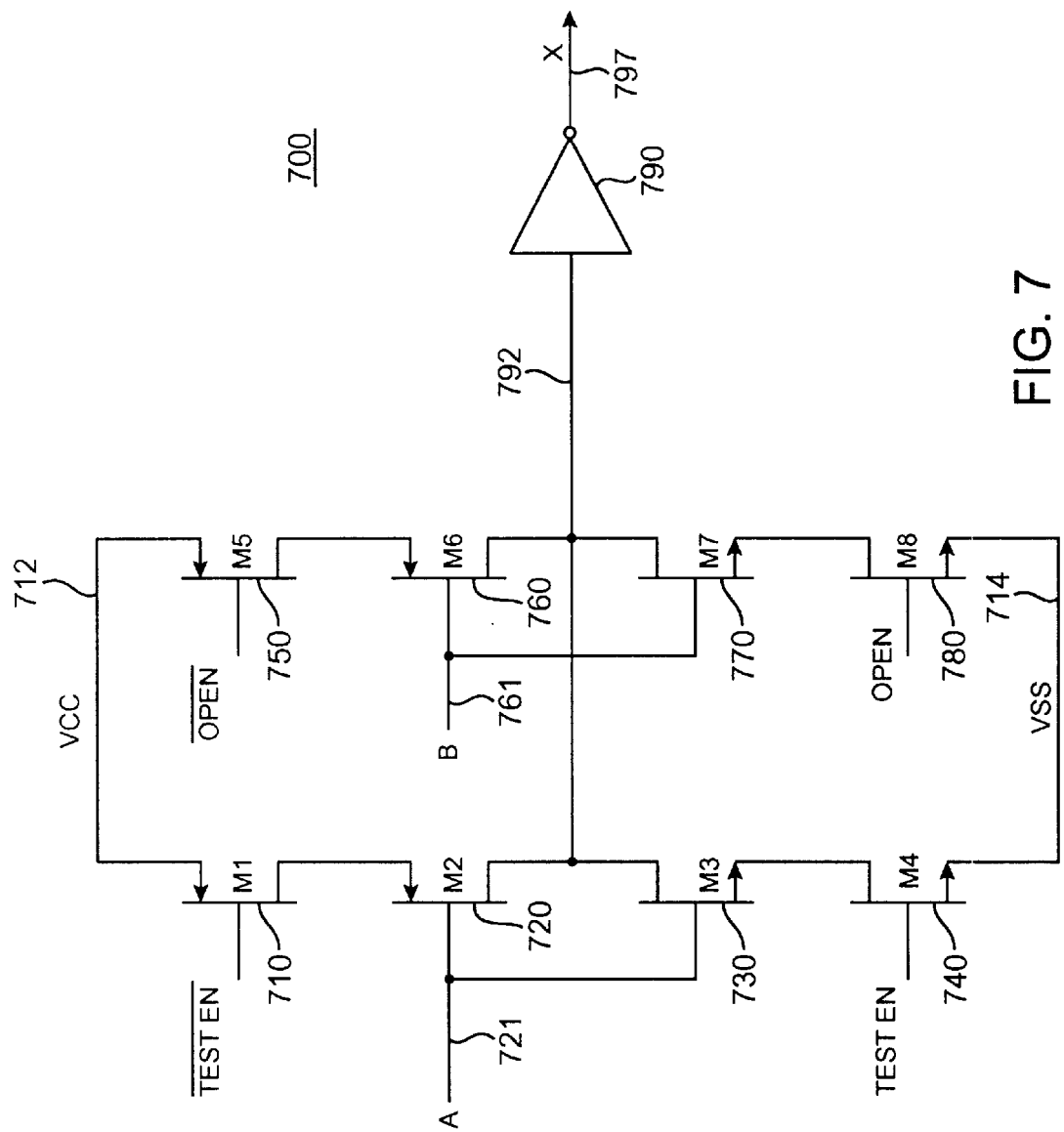
FIG. 7 is a schematic of an output buffer that may be used in the block diagram of FIG. 2.

FIG. 7 is a schematic of an output buffer which may be used as the output buffer 205 in FIG. 2, or other memory devices, consistent with embodiments of the present invention. Included are p-channel devices M1 710, M2 720, M5 750, and M6 760, n-channel devices M3 730, M4 740, M7 770, and M8 780, and output inverter 790. An A input is provided, which may be the output of the parity-check block, and a B input is provided, which may connect to a read driver circuit. In the test mode, the TEST EN signal on line 740 is high, and the $\overline{\text{TESTEN}}$ signal on line 710 is low. These signals may be true and complement versions of the test mode signal provided on line 217 in FIG. 2, or other similar signal. Thus, the devices M1 710 and M4 740 are conducting, and the signal A on line 721 is inverted, and driven onto line 792. This resulting signal is inverted by the output inverter 790, and driven onto the output line 797 as the output signal X. In the operational mode, the TEST EN signal is low, and the OP EN signal on line 780 is high. Accordingly, the devices M8 780 and M5 750 are conducting, and the signal B on line 761 is inverted, and driven onto line 792. This resulting signal is inverted by the output inverter 790, and driven onto the output line 797 as the output signal X.

Figure 8:
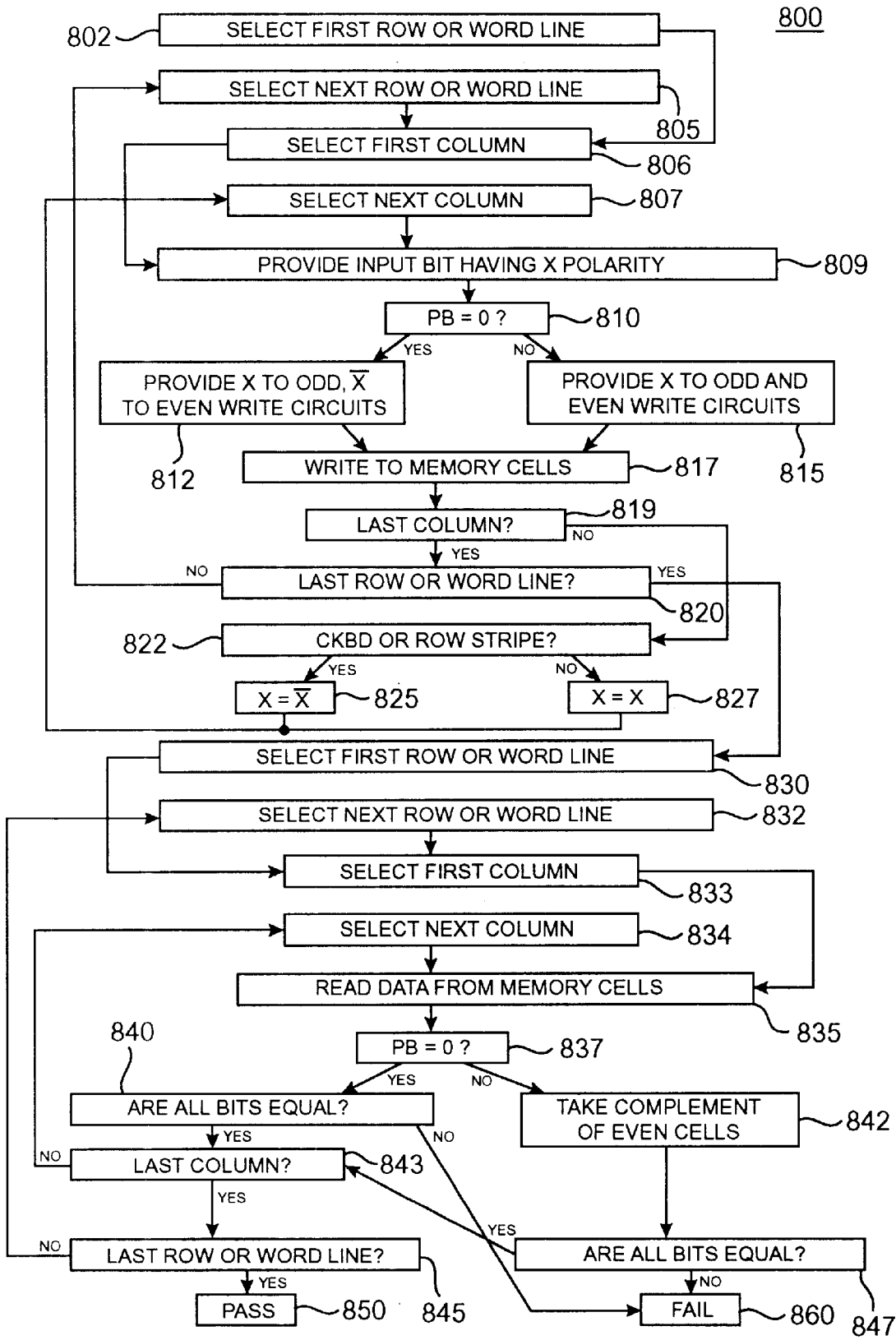
FIG. 8 is a flow chart of a method of testing a group of memory cells consistent with an embodiment of the present invention.

FIG. 8 illustrates a flow chart 800 for a method of testing memory devices consistent with an embodiment of the present invention. This flow chart enables the testing of memory devices in a solid, row stripe, column stripe, or checkerboard pattern. It will be obvious to one skilled in the art that modifications may be made to this flow chart to enable testing of memory devices using other types of patterns. The information required by the flow chart includes the polarity of the pattern bit, and whether a pattern requiring the data input to change, such as a checkerboard or row stripe pattern, or a pattern where the data input remains static, such as when a column stripe or solid pattern, is desired.

In act 802, a first row or word line is selected. The selected word line may be considered first because it has the lowest binary address on the device, or because it has the lowest binary address of a group of word lines. Alternately, it may be first for any other reason, or for no reason at all, other than testing must begin somewhere. A first column address is selected in act 806. Again, "first" has a temporal connotation. An input bit having a polarity of X is provided an act 809. In act 810 it is determined whether the pattern bit is equal to 0. If it is, then a bit having a polarity of X is provided to the odd write circuits, and a bit having a polarity $\overline{X}$ is provided to the even write circuits in act 812. If the pattern bit is not equal to 0, the bit of polarity X is provided to both the odd and even write circuits in act 815. In act 817 the data is written to the memory cells. In act 819, it is determined that if the last column has been written to. If it is not, it is determined in act 822 if a checkerboard or row stripe pattern is desired. If the test pattern is either a checkerboard or a row stripe, X is inverted in act 825, the next column is selected in act 807, and the process repeats. If a checkerboard or row stripe pattern is not desired, that is either a solid or column stripe pattern is desired, the polarity of the input remains the same in act 827, the next column is selected in act 807, and the process continues. If the last column has been reached, it is determined whether the last row has been reached in act 820. If it has not, the next row is selected in act 805.

When the last row is reached in act 820, a first row or word line is again selected in act 830. This first row may be the same or different row as the first row chosen in act 802. A first column is selected in act 833. Again, first is merely temporal, though it may correspond to an addressing scheme. Data is read from the memory cells in act 835. If the pattern bit is equal to 0, as determined in act 837, all bits are checked to see if they are equal to each other in act 840. If they are not, a failure has occurred, act 860. If all are equal, the it is determined in act 843 whether this is the last column. If not, a next column is selected in act 834. If the last column has been reached, it is determined if the last row has been reached in act 845. If it has, the device has passed, act 850. If the last row has not been reached, the next row is selected in act 832. If the pattern bit is not equal to 0, that is the pattern bit is equal to 1, the complements of the data read from the even memory cells is taken in act 842. Again, all bits are checked for equality, that is it is determined if the bits read from the odd cells and the complements of the even cells are equal to each other in act 847. If they are not, a failure has occurred, act 860. If they are, then it is determined whether the last column has been reached in act 845. If not, the next column is selected, act 834. Again, if it is the last column, it is determined if the last row has been reached, in act 845. If it has, the device has passed, act 850. If the last row has not been reached, the next row is selected in act 832, and the process continues either until a failure are occurs or until the last row is reached in act 845.

Embodiments of the present invention have been explained with reference to particular examples and figures. Other embodiments will be apparent to those of ordinary skill in the art. Therefore, it is not intended that this invention be limited except as indicated by the claims.

What is claimed is:

1. A method of testing a memory device comprising:
receiving a first input data bit having a first polarity;
receiving a second input data bit having a second polarity, wherein the second polarity is the complement of the first polarity;
writing the first input data bit to a first portion of a plurality of memory cells using a first plurality of write buffers;
writing the second input data bit to a second portion of the plurality of memory cells using a second plurality of write buffers;
reading a first plurality of data bits from the first portion of the plurality of memory cells;
reading a second plurality of data bits from the second portion of the plurality of memory cells; and
generating an output signal if the first plurality of data bits and complements of the second plurality of data bits each have the same polarity.

2. The method of claim 1 further comprising:
receiving a third input data bit having the second polarity;
receiving a fourth input data bit having the first polarity;
writing the third input data bit to a third portion of the plurality of memory cells using the first plurality of write buffers;
writing the fourth input data bit to a fourth portion of the plurality of memory cells using the second plurality of write buffers;
reading a third plurality of data bits from the third portion of the plurality of memory cells;
reading a fourth plurality of data bits from the fourth portion of the plurality of memory cells; and
generating an output signal if the third plurality of data bits and complements of the fourth plurality of data bits each have the same polarity.

3. The method of claim 2 wherein the data written to the first, second, third, and fourth plurality of memory cells forms a checkerboard pattern.

4. The method of claim 2 wherein the number of memory cells in the first plurality of memory cells, the number of memory cells in the second plurality of memory cells, the number of memory cells in the third plurality of memory cells, and the number of memory cells in the fourth plurality of memory cells are equal.

5. A memory device comprising:

an input/output pad;

a first plurality of write buffers coupled to the input/output pad;

a first plurality of multiplexers coupled to the input/output pad;

a second plurality of write buffers, each coupled to one of the first plurality of multiplexers;

a first plurality of memory cells, each selectively coupled to one of the first plurality of write buffers;

a second plurality of memory cells, each selectively coupled to one of the second plurality of write buffers;

a first plurality of sense amplifiers, each selectively coupled to one of the first plurality of memory cells;

a second plurality of sense amplifiers, each selectively coupled to one of the second plurality of memory cells; and a second plurality of multiplexers, each coupled to one of the second plurality of sense amplifiers.

6. The memory device of claim 5 further comprising:

a parity-check block coupled to the first plurality of sense amplifiers and the second plurality of multiplexers.

7. The memory device of claim 6 further comprising:

an output buffer coupled between the parity-check block and the input/output pad.

8. The memory device of claim 7 wherein the input/output pad receives a first data bit having a first polarity, and each of the first plurality of multiplexers provides a second data bit having either the first polarity or a second polarity, where the second polarity and the first polarity are complements.

9. The memory device of claim 7 wherein each of the second plurality of multiplexers receives a data bit having a polarity from one of the second plurality of sense amplifiers, and provides a data bit having either the same polarity as the received data bit, or its complement.

10. The memory device of claim 7 wherein the parity-check block receives inputs from the first plurality of sense amplifiers and the second plurality of multiplexers, and outputs a signal having a first polarity when all its inputs have the same polarity.

11. A memory device comprising:

an input means for receiving data;

a first writing means for receiving data from the input means and for writing data to a first plurality of memory cells;

a first multiplexing means for receiving data from the input means and for either inverting the data or not inverting the data;

a second writing means for receiving data from the first multiplexing means and for writing data to a second plurality of memory cells;

a first sense amplifier means for reading data from the first plurality of memory cells; and a second sense amplifier means for reading data from the second plurality of memory cells.

12. The memory device of claim 11 further comprising:

a second multiplexing means for receiving data from the first sense amplifier means and for either inverting the data or not inverting the data; and a parity-checking means for receiving data from the second multiplexing means and the second sense amplifier means and for checking if the polarity of the data from the second multiplexing means and the second sense amplifier means are the same.

13. The memory device of claim 12 wherein the parity-checking means provides a pass signal if the polarity of data from the second multiplexing means and the polarity of the data from the second sense amplifier means are equal.

14. The memory device of claim 11 further comprising:

a second multiplexing means for receiving data from the second sense amplifier means and for either inverting the data or not inverting the data; and a parity-checking means for receiving data from the second multiplexing means and the first sense amplifier means and for checking if the polarity of the data from the second multiplexing means and the first sense amplifier means are the same.

15. The memory device of claim 14 wherein the parity-checking means provides a pass signal if the polarity of data from the second multiplexing means and the polarity of the data from the first sense amplifier means are equal.

16. A method of testing a memory device, the memory device comprising a plurality of memory cells arranged in rows and columns, wherein each memory cell is written to by one of a plurality of write circuits, the plurality of write circuits comprising a plurality of even write circuits and a plurality of odd write circuits, wherein the memory cells that are written to by an even write circuit are read by one of a plurality of even read circuits, and the memory cells that are written to by an odd write circuit are read by one of a plurality of odd read circuits, the method comprising:

selecting a first row of memory cells;

selecting a first column of memory cells;

providing an input bit;

checking if a mode bit has a first polarity, and if it does then;

providing the input bit to both the odd and even write circuits; else providing the input bit to the odd write circuits, and a complement of the input bit to the even write circuits; and writing from the even and odd write circuits to memory cells in the selected row and column.

17. The method of claim 16 further comprising:

determining if each memory cell in the selected row has been written to, and if it has; then selecting a next row; else selecting a next column.

18. The method of claim 16 further comprising:

determining if each memory cell in the selected row has been written to, and if it has not; then selecting a next column; else selecting a next row and if a checkerboard or row stripe pattern is being used, then inverting a polarity of the input bit, else not inverting the polarity of the input bit.

19. The method of claim 18 further comprising:

selecting a first row of memory cells;

selecting a first column of memory cells;

reading a first plurality of data bits from the memory cells in the selected row and column using the plurality of even read circuits;

reading a second plurality of data bits from the memory cells in the selected row and column using the plurality of odd read circuits;

checking if a mode bit is has a first polarity, and if it does then;

determining if each of the first and second pluralities of data bits have the same polarity; else determining if each of the first plurality of data bits and complements of the second plurality of data bits have the same polarity.

20. The method of claim 19 further comprising:

determining if each memory cell in the selected row has been read from, and if it has; then selecting a next row; else selecting a next column.

* * * * *